(12) United States Patent
Yap et al.

(10) Patent No.: US 7,400,040 B2
(45) Date of Patent: Jul. 15, 2008

(54) THERMAL INTERFACE APPARATUS, SYSTEMS, AND METHODS

(75) Inventors: Eng Hooi Yap, Penang (MY); Cheng Siew Tay, Penang (MY); Pek Chew Tan, Penang (MY)

(73) Assignee: Intel Corporation, Santa Clara, CA (US)

( * ) Notice: Subject to any disclaimer, the term of this patent is extended or adjusted under 35 U.S.C. 154(b) by 326 days.

(21) Appl. No.: 10/458,603

(22) Filed: Jun. 10, 2003

(65) Prior Publication Data

US 2004/0256720 A1   Dec. 23, 2004

(51) Int. Cl.
*H01L 23/48*  (2006.01)
*H01L 23/52*  (2006.01)
*H01L 29/40*  (2006.01)

(52) U.S. Cl. ............... 257/747; 257/748; 257/720

(58) Field of Classification Search ............ 257/747, 257/748, 778, 690, 734, 706, 713, 635, 758–759, 257/762, 773–774, 720, 741, E23.11; 174/254–258; 361/749, 750, 792, 795; 428/29, 901; 438/107–109
See application file for complete search history.

(56) References Cited

U.S. PATENT DOCUMENTS

| | | | |
|---|---|---|---|
| 4,246,595 A * | 1/1981 | Noyori et al. ............ 257/668 |
| 5,224,017 A * | 6/1993 | Martin .................... 361/707 |
| 5,909,123 A * | 6/1999 | Budnaitis ................. 324/760 |
| 6,207,259 B1 * | 3/2001 | Iino et al. ................ 428/209 |
| 6,281,445 B1 * | 8/2001 | Yokoyama ............... 174/250 |
| 6,333,469 B1 * | 12/2001 | Inoue et al. .............. 174/260 |
| 6,426,545 B1 * | 7/2002 | Eichelberger et al. ..... 257/633 |
| 6,509,217 B1 * | 1/2003 | Reddy .................... 438/153 |
| 6,545,642 B1 * | 4/2003 | Doub et al. .............. 343/702 |
| 6,734,535 B1 * | 5/2004 | Hashimoto .............. 257/668 |
| 6,759,115 B2 * | 7/2004 | Iha ........................ 428/210 |
| 6,865,090 B2 * | 3/2005 | Wajima et al. ........... 361/793 |
| 6,883,215 B2 * | 4/2005 | Takeuchi et al. ......... 29/25.35 |
| 2001/0010945 A1 * | 8/2001 | Miyazaki ................ 438/107 |
| 2002/0038990 A1 * | 4/2002 | Horner et al. ............ 310/363 |
| 2002/0094639 A1 * | 7/2002 | Reddy .................... 438/257 |
| 2002/0096357 A1 * | 7/2002 | Iwasaki et al. .......... 174/250 |
| 2002/0172021 A1 * | 11/2002 | Seri et al. ................ 361/760 |
| 2003/0147227 A1 * | 8/2003 | Egitto et al. ............ 361/795 |
| 2003/0160317 A1 * | 8/2003 | Sakamoto et al. ........ 257/690 |
| 2005/0045371 A1 * | 3/2005 | Iwasaki et al. .......... 174/250 |

* cited by examiner

*Primary Examiner*—Zandra V. Smith
*Assistant Examiner*—Thanh Y. Tran
(74) *Attorney, Agent, or Firm*—Schwegman, Lundberg & Woessner, P.A.

(57) ABSTRACT

An apparatus and system, as well as fabrication methods therefor, may include a substrate coupled to a first material and a second material. The first and second materials may comprise adjacent metals, and may have different coefficients of thermal expansion sufficient to reduce the amount of substrate warp that can occur due to heating and cooling.

24 Claims, 2 Drawing Sheets

THERMAL INTERFACE APPARATUS, SYSTEMS, AND METHODS

TECHNICAL FIELD

The subject matter relates generally to apparatus, systems, and methods that can be used to assist in controlling substrate warp due to environmental temperature variations.

BACKGROUND INFORMATION

Electronic components, such as integrated circuits, may be assembled into component packages by physically and electrically coupling them to a substrate. During some packaging operations, such as reflow assembly processes, heat may be applied to the substrate. Sometimes heating and cooling substrates in this manner, including substrates used in ball grid array (BGA) packages, results in warping the substrate. Heat spreaders and other heat dissipating elements may be attached to the package, reducing the amount of warp in the substrate. However, even when heat dissipating elements are attached, substrate warp may result in low solder ball attach yield, and open joints. Various types of substrates, including circuit boards, may benefit from controlling substrate warp over temperature.

DETAILED DESCRIPTION

Figure 1:
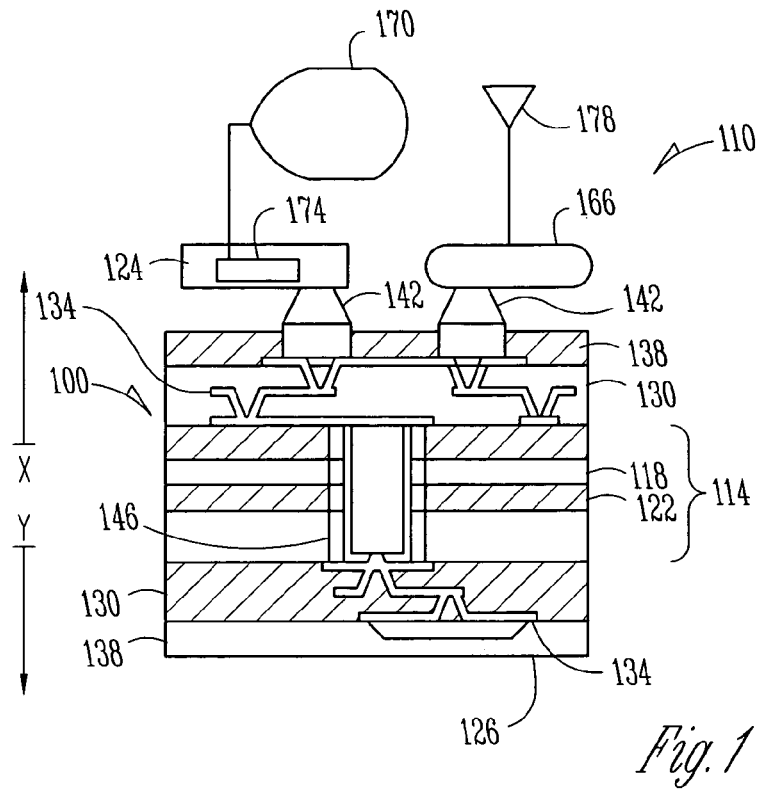
FIG. 1 is a side cut-away view of apparatus and systems according to various embodiments.

In the following detailed description of various embodiments, reference is made to the accompanying drawings that form a part hereof, and in which are shown by way of illustration, and not of limitation, specific embodiments in which the subject matter may be practiced. In the drawings, like numerals describe substantially similar components throughout the several views. The embodiments illustrated are described in sufficient detail to enable those skilled in the art to practice the teachings disclosed herein. Other embodiments may be utilized and derived therefrom, such that compositional, structural, and logical substitutions and changes may be made without departing from the scope of this disclosure. The following detailed description, therefore, is not to be taken in a limiting sense.

FIG. 1 is a side cut-away view of an apparatus 100 and system 110 according to various embodiments. For example, an apparatus 100 may comprise a substrate 114, a first material 118, and a second material 122. The first material 118 may have a first coefficient of thermal expansion (CTE) that is different than the CTE of the second material 122. Thus, when the first and second materials 118, 122 are bonded, attached, or otherwise coupled to the substrate 114, such as by being embedded within the substrate 114, and placed in close proximity to each other, or adjacent each other (as shown in FIG. 1), environmental temperature changes may result in the first and second materials 118, 122 bending in a controlled direction Y, the amount of which can be selected to offset a tendency by the substrate 114 to bend or warp in the opposite direction X.

For example, such activity may occur during packaging reflow operations, or when the substrate 114 is heated or cooled. In some embodiments, the first material 118 may be located between the second material 122 and a die 124 coupled to the substrate 114, wherein the first material 118 has a higher CTE than the CTE of the second material 122.

In some embodiments, environmental temperature changes may result in a tendency by the substrate 114 to bend or warp in the opposite direction, that is, in direction Y. In this case, the combination of the first and second materials 118, 122 should be selected so as to bend in the controlled direction X, the amount of such bending selected to offset the tendency of the substrate 114 to bend in the direction Y. In this situation, it may be desirable to select the second material 122 so as to have a higher CTE than the CTE of the first material 118.

Thus, for example, if the substrate 114 tends to warp in the X direction by 10 mils, violating an arbitrary coplanarity specification which limits surface warp to 8 mils or less, then the first a second materials 118, 122 can be embedded within the substrate 114, and selected so that each has a CTE which differs from the other by an amount sufficient to reduce the warp in the surface 126 of the substrate to less than about 8 mils. Still further, the first and second materials 118, 122 can be selected so that each has a CTE which differs from the other by an amount sufficient to reduce the warp in the surface 126 of the substrate 114 to less than about 5 mils, or some other limit, such as less than about 2 mils across the surface 126 of the substrate.

Therefore, judicious selection of the first and second materials 118, 122 may operate to reduce the amount of warp across a surface 126 of the substrate 114 within a selected temperature range. For example, the selected temperature range may be between about 20° C. and about 280° C.

In most embodiments, the difference between the CTE of the first material 118 and the CTE of the second material 122 should not be so great that excessive stress is applied to the substrate over a selected temperature range. Thus, in some embodiments, the CTE difference ratio between the first material 118 and the second material 122 may be less than about 10:1. That is, the CTE of the first material 118 may be selected to be as high as about ten times greater than the CTE of the second material 122 (for bending in one direction), and the CTE of the first material 118 may be selected to be as low as about one-tenth the CTE of the second material 122 (for bending in the opposite direction), or any value in-between, including a ratio of about 1:1.

In some embodiments, the first material 118, the second material 122, or both may comprise a metal, including but not limited to aluminum (CTE of about 22 ppm/K), steel (CTE of about 13 ppm/K), copper (CTE of about 17 ppm/K), gold (CTE of about 15 ppm/K), nickel (CTE of about 13 ppm/K), tin (CTE of about 24 ppm/K), and alloys of these. In other embodiments, either one or both of the first and the second materials 118, 122 may comprise any substance that provides a CTE differential sufficient to reduce the amount of warp in a surface 126 of the substrate 114 by a desired amount over a desired temperature range. The substrate 114 may comprise any number of materials or items, including but not limited to silicon (e.g., a silicon wafer), film, tape, one or more resins, fire-retardant 4 (FR-4) material, and/or and one or more polymers. The substrate 114 may comprise a part of any number of packages, assemblies, and/or systems, including but not limited to a tape carrier package (TCP), a system on film (SOF), a chip on board (COB), a chip size package (CSP), a BGA, a fine-pitch BGA (FPBGA), and/or a printed circuit board.

The substrate 114 may be coupled to a dielectric 130, and/or one or more conductors 134, such as copper foil conductors, and/or one or more layers of solder resist 138. The substrate 114 may also be coupled to solder bumps 142, and include vias 146.

Figure 2:
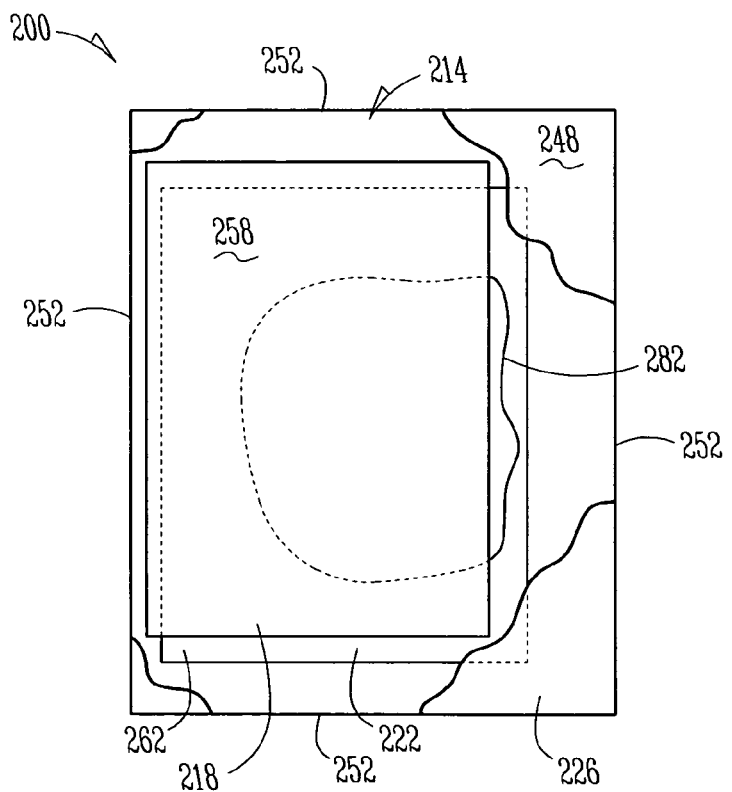
FIG. 2 is a top cut-away view of an apparatus according to various embodiments.

FIG. 2 is a top cut-away view of an apparatus 200 according to various embodiments. Here it can be seen that the substrate 214 may have a surface 226, the area 248 of which may be defined by a plurality of sides 252. The first material 218 and the second material 222 may each have a substantially similar amount of surface area, and may be located directly on top of each other so as to be completely overlapping, and to occupy a substantially similar portion of the substrate 214. The first material 218 and the second material 222 may also be located such that one partially overlaps the other. The area 248 may be a planar surface area. The first material 218 and the second material 222 may be coupled to the surface 226 of the substrate 214, or embedded within the substrate 214. In many embodiments, the first material 218 and the second material 222 may each have a surface area 258, 262, respectively, which is greater than about 60% of the surface area 248 associated with the substrate 214.

Still other embodiments may be realized. For example, referring now to FIGS. 1 and 2, a system 110 may comprise a wireless transceiver 166 coupled to the substrate 114, 214. The system 110 may also comprise a first material 118, 218 coupled to the substrate 114, 214 and a second material 122, 222 coupled to the substrate 114, 214. The first material 118, 218 may have a CTE different from the CTE of the second material 122, 222, such that the difference between the CTE of the first and second materials 118, 218 and 122, 222 operates to reduce the amount of warp across a surface 126, 226 of the substrate 114, 214 within a selected temperature range.

The system 110 may also comprise a display 170 coupled to a processor 174 and the wireless transceiver 166, which may be a radio frequency transceiver coupled to an antenna 178. The substrate 114, 214 may have a surface area 248, such as a planar surface area, wherein the first material 118, 218 and the second material 122, 222 each have a surface area 258, 262 which is greater than about 60% of the surface area 248 of the substrate 114, 214.

It should be noted that the first material 118, 218 and the second material 122, 222 may each have a surface area 258, 262 which is coextensive with the surface area 248 of the substrate 114, 214 (e.g., see FIG. 1). In some embodiments, the first material 118, 218 and the second material 122, 222 may each have a surface area which is greater than the surface area 248 of the substrate 114, 214 (not shown). The first material 118, 218 may be adjacent the secondary material 122, 222 (see FIG. 1), or the first material 118, 218 may be located proximate to the second material 122, 222 (see FIG. 2), wherein other materials 282 are located between the first material 118, 218 and the second material 122, 222.

It should also be understood that the apparatus and systems of various embodiments can be used in applications other than for coupling and heat transfer between dice and heat dissipating elements, and thus, the embodiments shown are not to be so limited. The illustrations of an apparatus 100, 200 and system 110 are intended to provide a general understanding of the elements and structure of various embodiments, and they are not intended to serve as a complete description of all the features of apparatus, and systems that might make use of the elements and structures described herein.

Applications that may include the novel apparatus and systems of various embodiments include electronic circuitry used in high-speed computers, communication and signal processing circuitry, data transceivers, modems, processor modules, embedded processors, and application-specific modules, including multilayer, multi-chip modules. Such apparatus and systems may further be included as sub-components within a variety of electronic systems, such as televisions, cellular telephones, personal computers, workstations, radios, video players, vehicles, and others.

Figure 3:
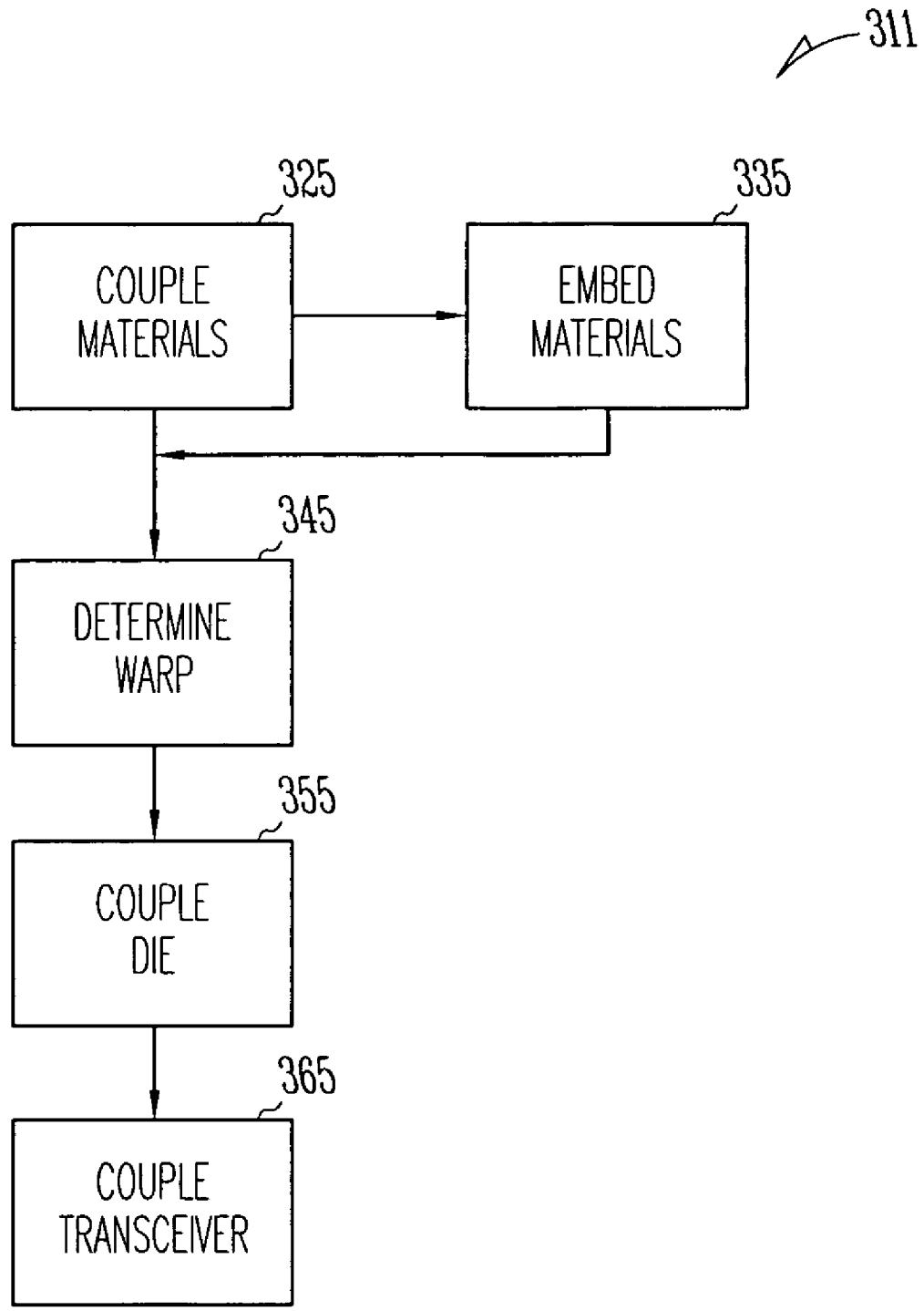
FIG. 3 is a flow chart illustrating several methods according to various embodiments.

Some embodiments include a number of methods. For example, FIG. 3 is a flow chart illustrating several methods 311 according to various embodiments. Thus, a method 311 may (optionally) begin with coupling a first material and a second material to a substrate at block 325, wherein the first material may have a CTE different from the CTE of the second material, such that the difference between the coefficients of thermal expansion in the first and second materials operates to reduce the amount of warp across a surface of the substrate within a selected temperature range. Coupling the first material and the second material to the substrate at block 325 may also include coupling the first material to the second material. Coupling the first material and the second material to the substrate at block 325 may further comprise embedding the first material and the second material in the substrate at block 335.

The method 311 may continue with determining an amount of warp across a surface of the substrate over a selected temperature range at block at block 345. The method 311 may also include coupling a die to the substrate 355, and coupling a wireless transceiver to a circuit (perhaps located on the die) coupled to the substrate at block 365.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. An apparatus, comprising:
an integrated circuit package substrate having a first surface area;
a first material comprising a continuous metal layer of uniform thickness coupled to the integrated circuit package substrate and having a first coefficient of thermal expansion, and further having a second surface area; and
a second material comprising a continuous metal layer of uniform thickness adjacent to the first material coupled to the integrated circuit package substrate and having a second coefficient of thermal expansion different from the first coefficient of thermal expansion to reduce an amount of warp across a surface of the integrated circuit package substrate within a selected temperature range, and further having a third surface area;
wherein the second and third surface areas are substantially similar;

wherein the first material and the second material are embedded in the integrated circuit package substrate;

wherein the first material is located between the second material and a die coupled to the integrated circuit package substrate; and wherein the first material has a higher coefficient of thermal expansion than a coefficient of thermal expansion of the second material.

2. The apparatus of claim 1, wherein the integrated circuit package substrate is included in a ball grid array.

3. The apparatus of claim 1, wherein the integrated circuit package substrate is included in a printed circuit board.

4. The apparatus of claim 1, wherein the first material and the second material each occupy a substantially similar portion of the integrated circuit package substrate.

5. The apparatus of claim 1, wherein a coefficient of thermal expansion difference ratio between the first material and the second material is less than about 10:1.

6. A system, comprising:

a wireless transceiver;

an integrated circuit package substrate coupled to the wireless transceiver;

a first material comprising a continuous metal layer coupled to the integrated circuit package substrate and having a first coefficient of thermal expansion; and a second material comprising a continuous metal layer adjacent to the first material coupled to the integrated circuit package substrate and having a second coefficient of thermal expansion different from the first coefficient of thermal expansion;

wherein the first material and the second material are embedded in the integrated circuit package substrate;

wherein the first material is located between the second material and a die coupled to the integrated circuit package substrate; and wherein the first material has a higher coefficient of thermal expansion than a coefficient of thermal expansion of the second material.

7. The system of claim 6, further comprising:

a display coupled to a processor and the wireless transceiver.

8. The system of claim 7, wherein the integrated circuit package substrate has a planar surface area, and wherein the first material and the second material each have a surface area greater than about 60% of the planar surface area.

9. The system of claim 7, wherein the wireless transceiver is coupled to an antenna.

10. A method, comprising:

coupling a first material comprising a continuous metal layer having a first coefficient of thermal expansion to an integrated circuit package substrate;

coupling a second material comprising a continuous metal layer adjacent to the first material coupled to the integrated circuit package substrate, the second material having a second coefficient of thermal expansion different from the first coefficient of thermal expansion; and coupling the first material to the second material;

wherein the first material and the second material are embedded in the integrated circuit package substrate;

wherein the first material is located between the second material and a die coupled to the integrated circuit package substrate; and wherein the first material has a higher coefficient of thermal expansion than a coefficient of thermal expansion of the second material.

11. The method of claim 10, further comprising:

coupling a die to the integrated circuit package substrate.

12. The method of claim 10, wherein coupling the first material and the second material to the integrated circuit package substrate further comprises:

embedding the first material and the second material in the integrated circuit package substrate.

13. The method of claim 10, further comprising:

determining an amount of warp across a surface of the integrated circuit package substrate over a selected temperature range.

14. The method of claim 10, further comprising:

coupling a wireless transceiver to a circuit coupled to the integrated circuit package substrate.

15. An apparatus, comprising:

an integrated circuit package substrate;

a first material comprising a continuous metal layer coupled to the integrated circuit package substrate and having a first coefficient of thermal expansion; and a second material comprising a continuous metal layer adjacent to the first material coupled to the integrated circuit package substrate and having a second coefficient of thermal expansion different from the first coefficient of thermal expansion;

wherein the first material and the second material are embedded in the integrated circuit package substrate;

wherein the first material is located between the second material and a die coupled to the integrated circuit package substrate; and wherein the first material has a higher coefficient of thermal expansion than a coefficient of thermal expansion of the second material.

16. The apparatus of claim 15, wherein the integrated circuit package substrate is included in a ball grid array.

17. The apparatus of claim 15, wherein the integrated circuit package substrate is included in a printed circuit board.

18. The apparatus of claim 15, wherein the first material and the second material each occupy a substantially similar portion of the integrated circuit package substrate.

19. The apparatus of claim 15, wherein a coefficient of thermal expansion difference ratio between the first material and the second material is less than about 10:1.

20. An apparatus, comprising:

an integrated circuit package substrate;

a first material comprising a continuous metal layer coupled to the integrated circuit package substrate and having a first coefficient of thermal expansion; and a second material comprising a continuous metal layer adjacent to the first material coupled to the integrated circuit package substrate and having a second coefficient of thermal expansion different from the first coefficient of thermal expansion;

wherein the first material and the second material are embedded in the integrated circuit package substrate;

wherein the first material is located between the second material and a die coupled to the integrated circuit package substrate; and wherein the second material has a higher coefficient of thermal expansion than a coefficient of thermal expansion of the first material.

21. The apparatus of claim 20, wherein the integrated circuit package substrate is included in a ball grid array.

22. The apparatus of claim 20, wherein the integrated circuit package substrate is included in a printed circuit board.

23. The apparatus of claim 20, wherein the first material and the second material each occupy a substantially similar portion of the integrated circuit package substrate.

24. The apparatus of claim 20, wherein a coefficient of thermal expansion difference ratio between the first material and the second material is less than about 10:1.

* * * * *